United States Patent
Wang et al.

(10) Patent No.: US 7,501,342 B2
(45) Date of Patent: Mar. 10, 2009

(54) DEVICE HAVING HIGH ASPECT-RATIO VIA STRUCTURE IN LOW-DIELECTRIC MATERIAL AND METHOD FOR MANUFACTURING THE SAME

(75) Inventors: Wei Chung Wang, Kaohsiung County (TW); Po Jen Cheng, Kaohsiung (TW); Hsueh An Yang, Taipei (TW); Pei Chun Chen, Tainan County (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 0 days.

(21) Appl. No.: 12/050,601

(22) Filed: Mar. 18, 2008

(65) Prior Publication Data

US 2008/0303167 A1    Dec. 11, 2008

(30) Foreign Application Priority Data

Jun. 8, 2007    (TW) .............................. 96120674 A

(51) Int. Cl.
*H01L 21/44* (2006.01)

(52) U.S. Cl. .................. 438/675; 438/618; 438/637; 438/700; 257/E21.575; 257/E21.577; 257/E21.585

(58) Field of Classification Search ................. None
See application file for complete search history.

(56) References Cited

U.S. PATENT DOCUMENTS

| 7,235,428 | B2 * | 6/2007 | Tanida et al. ................. 438/118 |
| 2004/0077174 | A1 | 4/2004 | Yen et al. |
| 2005/0142857 | A1 * | 6/2005 | Lee ............................. 438/638 |

* cited by examiner

*Primary Examiner*—Walter L Lindsay, Jr.
*Assistant Examiner*—Cheung Lee

(57) ABSTRACT

A method for manufacturing a device having a via structure includes the following steps. A seed metallic layer is formed on a substrate. A patterned metallic-trace layer is formed on the seed metallic layer. A positive-type photoresist layer is formed on the patterned metallic-trace layer and seed metallic layer. The photoresist layer is patterned for defining a through hole which exposes a part of the patterned metallic-trace layer, wherein the through hole has a high aspect ratio. A metallic material is electroplated in the through hole so as to form a metallic pillar. The photoresist layer is removed. A part of the seed metallic layer is etched, whereby traces of the patterned metallic-trace layer are electrically isolated from each other. A dielectric material layer is formed on the substrate for sealing the patterned metallic-trace layer and a part of the metallic pillar and exposing a top surface of the metallic pillar.

11 Claims, 7 Drawing Sheets

DEVICE HAVING HIGH ASPECT-RATIO VIA STRUCTURE IN LOW-DIELECTRIC MATERIAL AND METHOD FOR MANUFACTURING THE SAME

CROSS REFERENCE TO RELATED APPLICATION

This application claims the priority benefit of Taiwan Patent Application Serial Number 096120674, filed Jun. 8, 2007, the full disclosure of which is incorporated herein by reference.

BACKGROUND OF THE INVENTION

1 Field of the Invention

The present invention generally relates to a via structure, and more particularly to a device having a via structure wherein the via structure has a high aspect ratio by utilizing a positive-type photoresist layer.

2. Description of the Related Art

Components located on the active surface of a semiconductor device become smaller in size as the geometric shape of the semiconductor device becomes gradually smaller. For example, the passive component (e.g. a capacitor) is constituted by two metallic layers and one via hole. In order to decrease the volume of the capacitor, it is necessary to decrease the area of the metallic layers. Also, it is necessary to have a high aspect ratio for the via hole. A conventional method for manufacturing a device having via hole generally utilizes the photosensitive benzocyclobutene (BCB) to act as a low-k dielectric material layer. However, the size of the via hole is limited by the property of the negative-type photosensitive BCB when the via hole having a small size is formed by exposing and developing the photosensitive BCB.

Referring to FIG. 1, it depicts a conventional semiconductor device 10. The semiconductor device 10 includes a silicon substrate 12, a plurality of metallic traces 16 and a low-k dielectric material layer 30 (photosensitive BCB). The silicon substrate 12 is provided with a plurality of pads 15 for electrically connecting to an integrated circuit (IC) (not shown) located on the active surface. The metallic traces 16 are disposed on the silicon substrate 12 and electrically connected to the pads 15. The dielectric material layer 30 (photosensitive BCB) is patterned by exposing and developing processes, thereby defining through holes 20. Metallic material 22 is formed in each through hole 20 so as to form a via hole 24 located on the metallic traces 16. The dielectric material layer 30 (photosensitive BCB) is made of a negative-type polymer material, and thus the resolution is not good when the through hole 20 is formed by exposing and developing the dielectric material layer 30 (photosensitive BCB). The through hole 20 formed in the dielectric material layer 30 of photosensitive BCB has an upper opening and a lower opening wherein the hole diameter of the upper opening is wider than that of the lower opening. Thus, the size of the via hole 24 cannot be very small. For example, considering the photosensitive BCB having a thickness t1 of 5 μm, the through hole 20 formed generally has a hole diameter d1 of 30 μm at most. Thus, the aspect ratio (the ratio of depth D1 to width W1) of the via hole 24 must be limited to less than 0.167. Also, when a small-sized via hole 24 is formed in the dielectric material layer 30 (photosensitive BCB) by the exposing and developing processes, it is easy to leave some residual BCB in the via hole 24, which is hard to remove. Thus, manufacturing and electrical problems tend to rise in the subsequent processes.

U.S. Patent Publication Number 2004/0077174, entitled "Method for forming a high aspect ratio via", discloses a method for manufacturing via holes. Although this patent discloses the method for manufacturing via holes having high aspect ratios, this patent fails to disclose that the via holes are formed by utilizing a positive-type photoresist layer, wherein the via holes are located in the low-k dielectric material layer and have high aspect ratios, being more than 0.167.

Accordingly, there exists a need for a device having a via structure capable of solving the above-mentioned problems.

SUMMARY OF THE INVENTION

It is an object of the present invention to provide a device having a via structure wherein the positive-type photoresist layer is utilized to form the via structure and then the low-k dielectric material is utilized to seal the via structure therein, whereby the via structure has a high aspect ratio.

In order to achieve the foregoing object, the present invention provides a method for manufacturing a device having a via structure, the method including the following steps of: providing a substrate; forming a seed metallic layer on the substrate; forming a patterned metallic-trace layer on the seed metallic layer; forming a positive-type photoresist layer on the patterned metallic-trace layer and the seed metallic layer; patterning the positive-type photoresist layer for defining at least one through hole which exposes a part of the patterned metallic-trace layer, wherein the through hole has a predetermined aspect ratio; electroplating a metallic material in the through hole so as to form a metallic pillar, wherein the metallic pillar has a top surface; removing the positive-type photoresist layer; etching a part of the seed metallic layer, whereby traces of the patterned metallic-trace layer are electrically isolated from each other; and forming a dielectric material layer on the substrate for sealing the patterned metallic-trace layer and a part of the metallic pillar and exposing the top surface of the metallic pillar. The metallic pillar is a via structure, and the aspect ratio of the metallic pillar is between 0.167 and 2.

Compared with the prior art, the present invention utilizes the positive-type photoresist layer to form the via structure and then utilizes low-k dielectric material to seal the via structure therein, whereby the via structure has a high aspect ratio. Furthermore, it is not necessary that the low-k dielectric material is limited to photosensitive polymer material. In other words, the low-k dielectric material can also be made of non-photosensitive polymer material. In addition, the redundant dielectric material is removed from the via structure of the present invention by using the dry etching process, thereby preventing subsequent processes from manufacturing and electrical problems. The high aspect-ratio via structure of the present invention located in the low-k dielectric material can be applied to the passive component (e.g. a capacitor) or Redistribution Layer in the field of semiconductor device.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
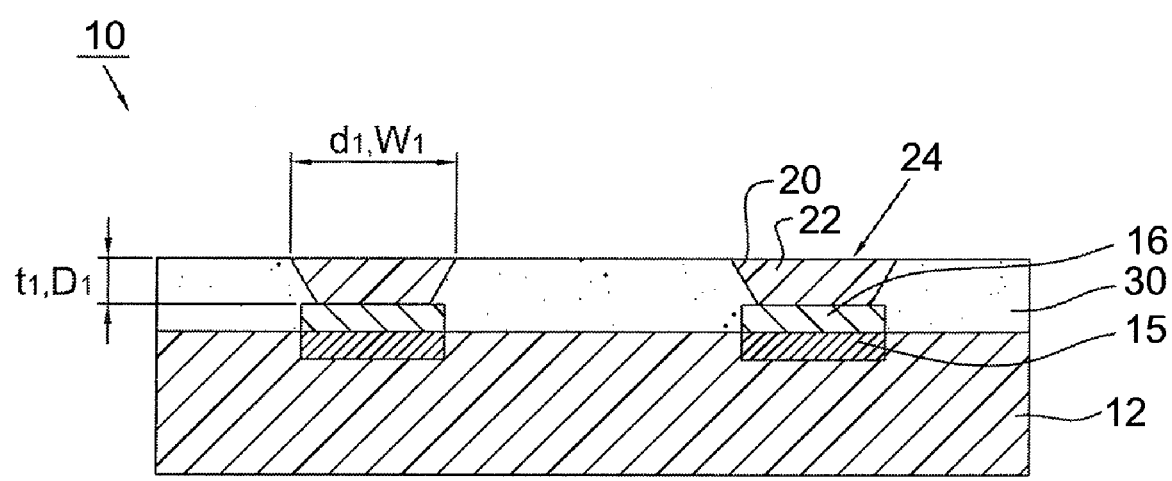
FIG. 1 is cross-sectional view of a semiconductor device having via holes in the prior art.
Figure 2:
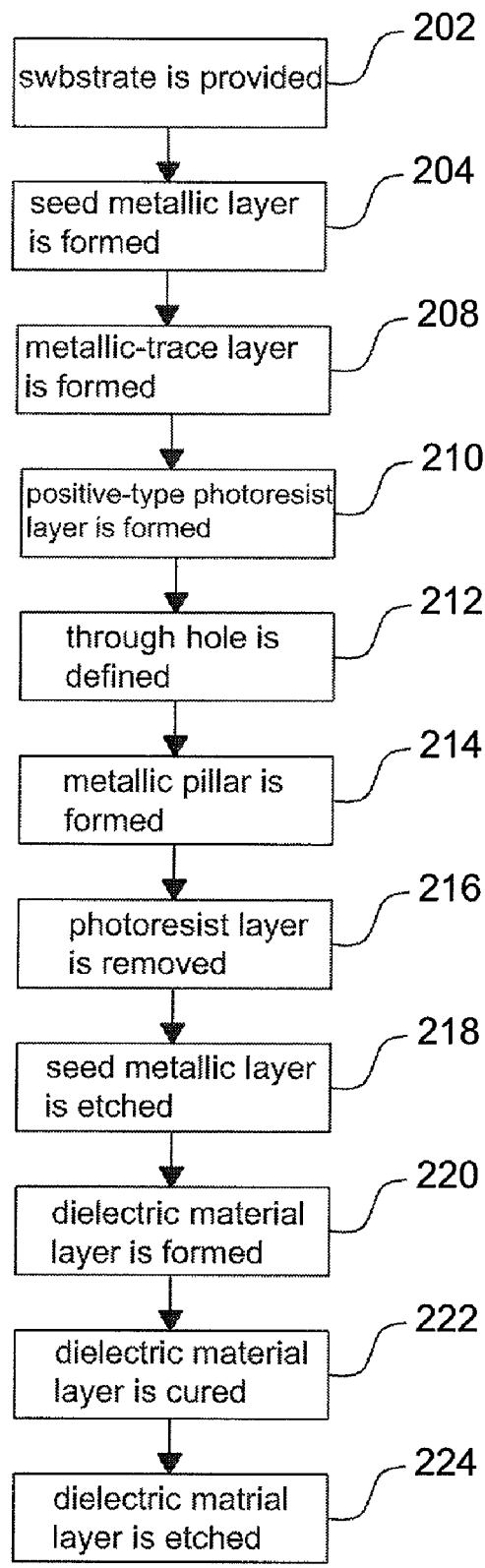
FIG. 2 is a flow diagram showing a method for manufacturing a device having a via structure according to the first embodiment of the present invention.
Figure 3:
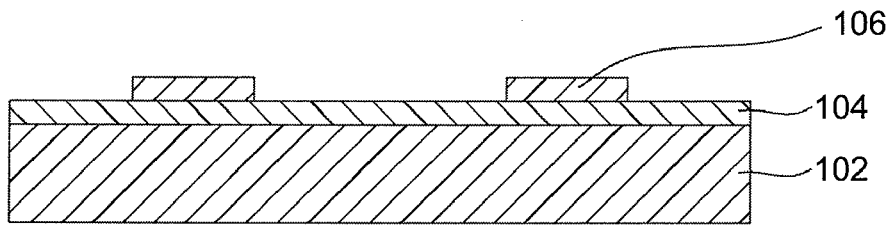
FIGS. 3 to 9 are cross-sectional views showing a method for manufacturing a device having a via structure according to the first embodiment of the present invention.

Referring to FIG. 2, it depicts a method for manufacturing a device having a via structure according to the first embodiment of the present invention. In this embodiment, the device 100 is used for Redistribution Layer (RDL). The method for manufacturing the device 100 includes the following steps. Referring to FIG. 3, in the step 202 a substrate 102, e.g. silicon substrate, is provided. In the step 204, a seed metallic layer 104 is formed on the substrate 102. In the step 208, a patterned metallic-trace layer 106 is formed on the seed metallic layer 104. For example, the patterned metallic-trace layer 106 can be formed on the seed metallic layer 104 by electroplating or photolithography/etching processes.

Figure 4:
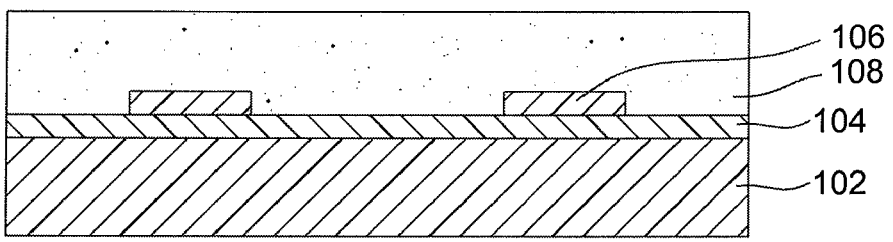

Referring to FIG. 4, in the step 210 a positive-type photosensitive photoresist layer 108 is formed on the patterned metallic-trace layer 106 and the seed metallic layer 104.

Figure 5:
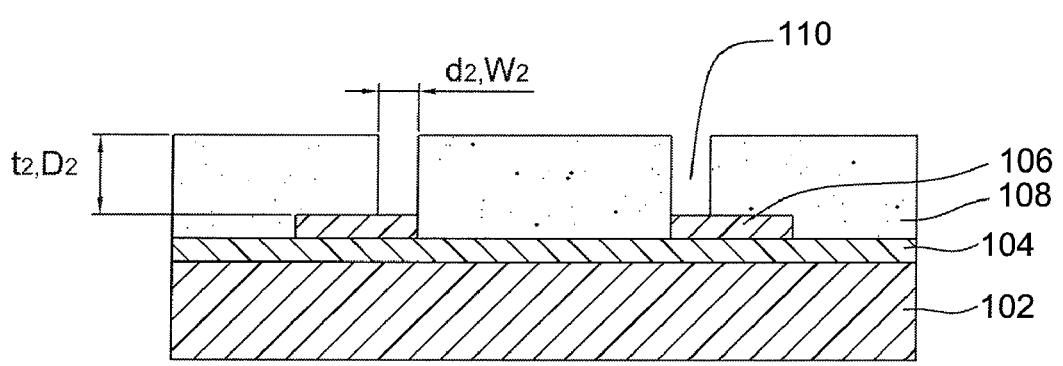

Referring to FIG. 5, in the step 212 the photoresist layer 108 is patterned for defining at least one through hole 110 which exposes a part of the patterned metallic-trace layer 106, wherein the through hole 110 has a predetermined aspect ratio. The photoresist layer 108 is made of the positive-type polymer material, and thus the resolution is good and the hole diameter of the through hole 110 is very small when the through hole 110 is formed by exposing and developing the photoresist layer 108. For example, considering the photosensitive photoresist layer 108 having a thickness t2 of 10 μm, the through hole 110 formed has a hole diameter d2 of 5 μm. Thus, the aspect ratio (the ratio of depth D2 to width W2) of the through hole 110 can be increased to 2 and is not limited to less than 0.167. Preferably, the predetermined aspect ratio of the through hole 110 can be between 0.167 and 2.

Figure 6:
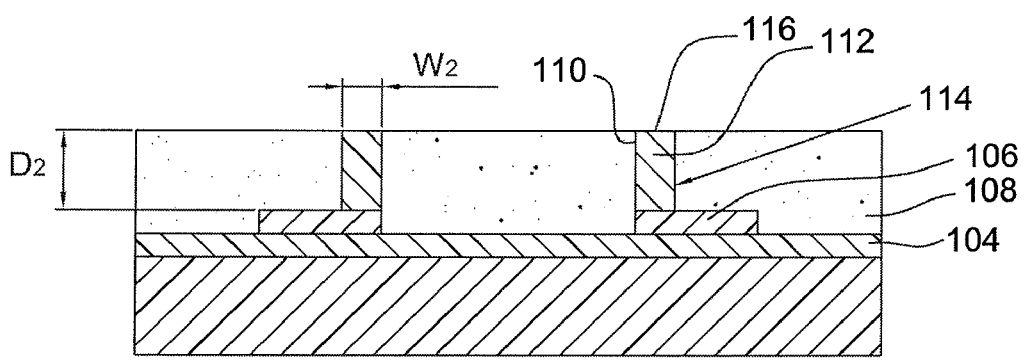

Referring to FIG. 6, in the step 214 at least one metallic material 112 is electroplated in the through hole 110 by using the seed metallic layer 104 as an electroplating line, thereby forming a metallic pillar 114 which is located on the metallic-trace layer 106 and has a top surface 116. The hole diameter of the through hole 110 defined by the photoresist layer 108 is very small, and thus the size of the metallic pillar 114 can be very small.

Figure 7:
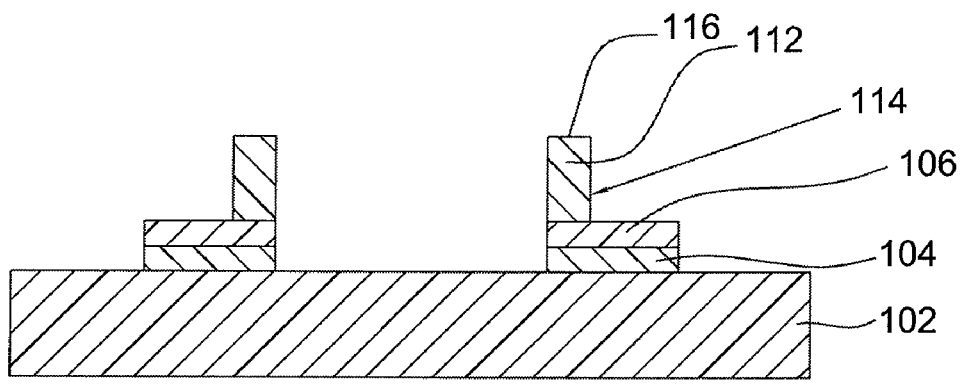

Referring to FIG. 7, in the step 216 the positive-type photoresist layer 108 is removed. In the step 218 a part of the seed metallic layer 104 is etched, whereby traces of the patterned metallic-trace layer 106 are electrically isolated from each other.

Figure 8:
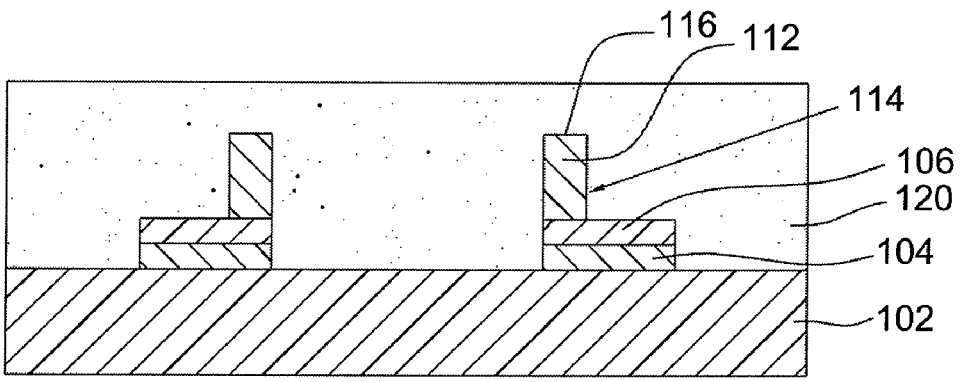

Referring to FIG. 8, in the step 220 a dielectric material layer 120 is formed on the substrate 102 by a coating process, thereby sealing the seed metallic layer 104, the patterned metallic-trace layer 106 and the metallic pillar 114. Preferably, the top surface 116 of the metallic pillar 114 is directly exposed from the dielectric material layer 120 by controlling the thickness of the dielectric material layer 120. The dielectric material layer 120 is made of low-k material having a dielectric constant of less than 3.5. The dielectric material layer 120 can be photosensitive. The photosensitive dielectric material layer can be made of negative-type polymer material, e.g. benzocyclobutene (BCB) or polyimide (PI). The photosensitive dielectric material layer can be also made of positive-type polymer material. Or, the dielectric material layer 120 can be made of non-photosensitive polymer material. In the step 222, the dielectric material layer 120 is cured.

Figure 9:
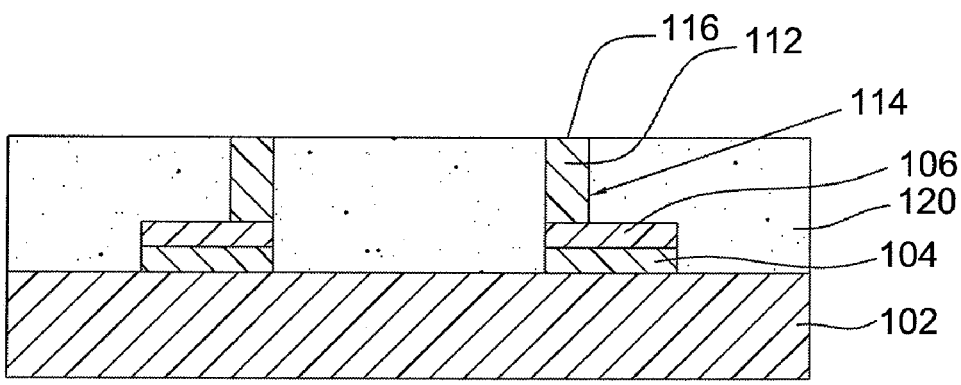

Referring to FIG. 9, in the step 224 the dielectric material layer 120 is etched to have a predetermined thickness for exposing the top surface 116 of the metallic pillar 114, thereby forming the device 100 used for Redistribution Layer (RDL), wherein the dielectric material layer 120 is dry-etched with an oxygen plasma etching process. More detailed, the metallic pillar 114 is a via structure, whose aspect ratio is the same as the predetermined aspect ratio (the ratio of depth D2 to width W2) of the through hole 110, e.g. the predetermined aspect ratio of the through hole 110 can be between 0.167 and 2.

Compared with the prior art, the present invention utilizes the positive-type photoresist layer to form the via structure and then utilizes low-k dielectric material to seal the via structure therein, whereby the via structure has a high aspect ratio. Furthermore, it is not necessary that the low-k dielectric material is limited to photosensitive polymer material. In other words, the low-k dielectric material can also be made of non-photosensitive polymer material. In addition, the redundant dielectric material is removed from the via structure of the present invention by using the dry etching process, thereby preventing subsequent processes from manufacturing and electrical problems.

Figure 10:
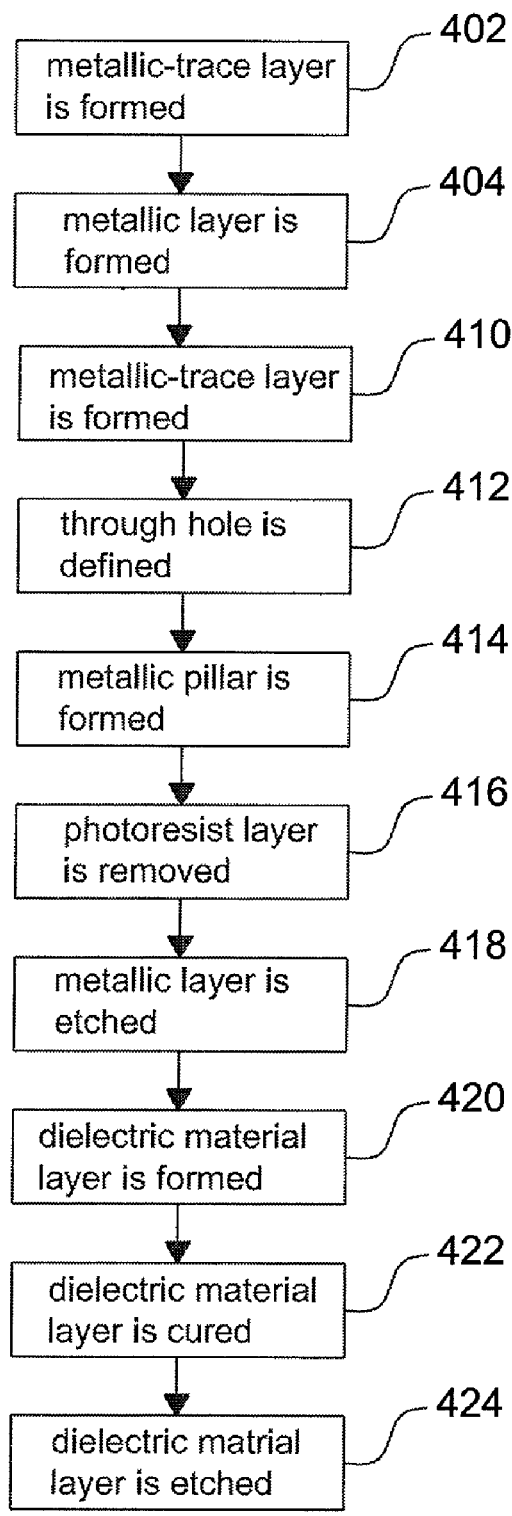
FIG. 10 is a flow diagram showing a method for manufacturing a device having a via structure according to the second embodiment of the present invention.
Figure 11:
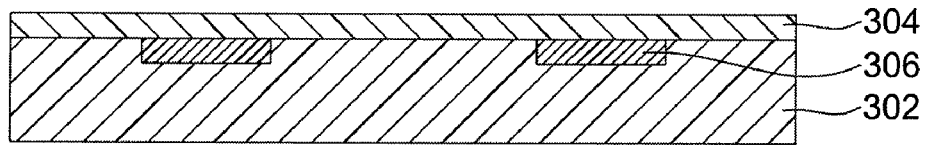
FIGS. 11 to 17 are cross-sectional views showing a method for manufacturing a device having a via structure according to the second embodiment of the present invention.

Referring to FIG. 10, it depicts a method for manufacturing a device having a via structure according to the second embodiment of the present invention. In this embodiment, the device is a semiconductor device 300. The method for manufacturing the device includes the following steps. Referring to FIG. 11, in the step 402 a substrate 302, e.g. silicon substrate, is provided and the substrate 302 includes a plurality of pads 306 electrically connected to an integrated circuit (IC) (not shown) located on the active surface. In the step 404, a metallic layer 304 is formed on the substrate 302 and electrically connected to the pads 306.

Figure 12:
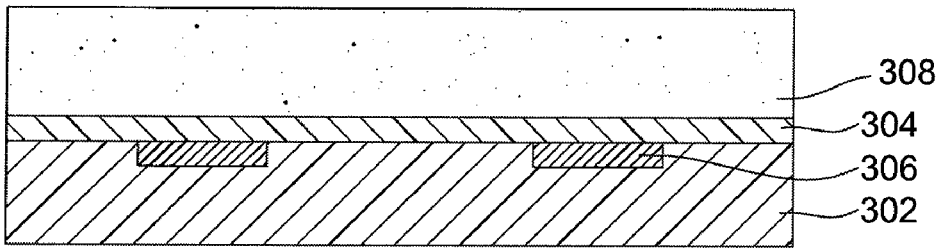

Referring to FIG. 12, in the step 410 a positive-type photosensitive photoresist layer 308 is formed on the metallic layer 304.

Figure 13:
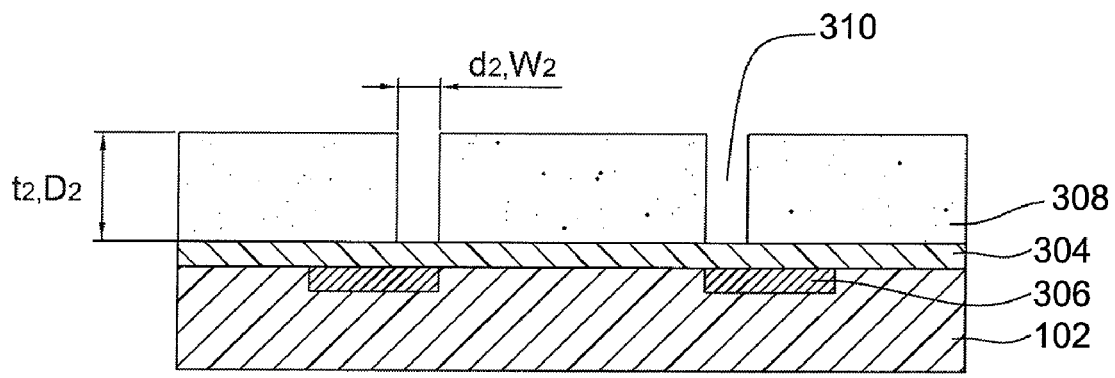

Referring to FIG. 13, in the step 412 the photoresist layer 308 is patterned for defining at least one through hole 310, which exposes a part of the metallic layer 304, corresponds to the location of the pad 306, and has a predetermined aspect ratio. The photoresist layer 308 is made of the positive-type polymer material, and thus the resolution is good and the hole diameter of the through hole 310 is very small when the through hole 310 is formed by exposing and developing the photoresist layer 308. For example, considering the photosensitive photoresist layer 308 having a thickness t2 of 10 μm, the through hole 310 formed has a hole diameter d2 of 5 μm. Thus, the aspect ratio (the ratio of depth D2 to width W2) of the through hole 310 can be increased to 2 and is not limited to less than 0.167. Preferably, the predetermined aspect ratio of the through hole 310 can be between 0.167 and 2.

Figure 14:
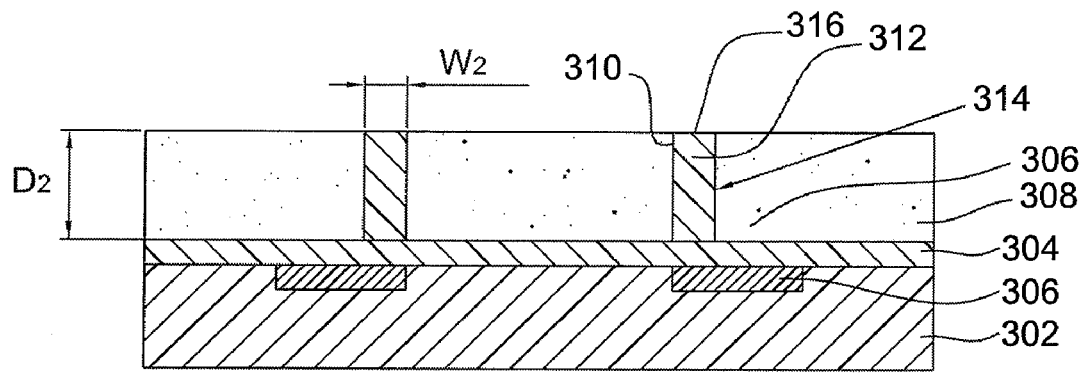

Referring to FIG. 14, in the step 414 at least one metallic material 312 is electroplated in the through hole 310 by using the metallic layer 304 as an electroplating line, thereby forming a metallic pillar 314 which is located on the metallic layer 304 and has a top surface 316. The hole diameter of the through hole 310 defined by the photoresist layer 308 is very small, and thus the size of the metallic pillar 314 can be very small.

Figure 15:
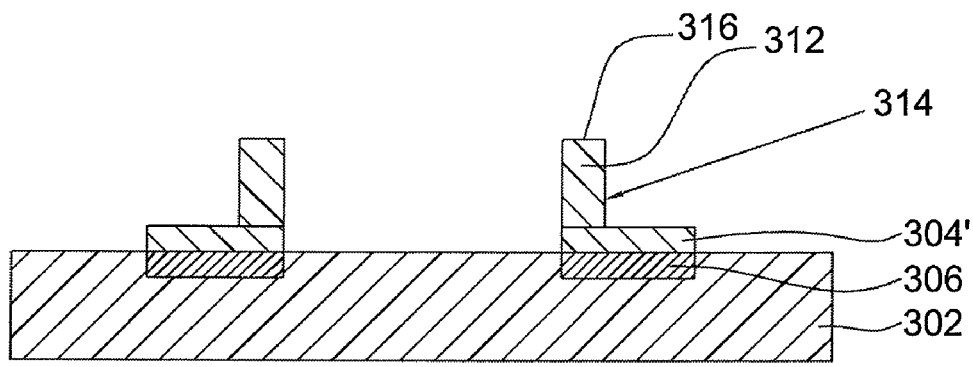

Referring to FIG. 15, in the step 416 the positive-type photoresist layer 308 is removed. In the step 418 a part of the metallic layer 304 is etched, whereby a metallic-trace layer 304' is formed, and the pads 306 are electrically isolated from each other.

Figure 16:
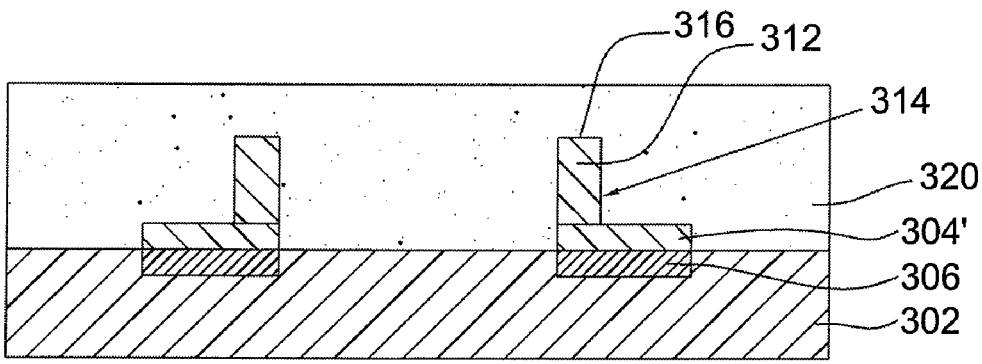

Referring to FIG. 16, in the step 420 a dielectric material layer 320 is formed on the substrate 302 by a coating process, thereby sealing the metallic-trace layer 304', the pads 306 and the metallic pillar 314. Preferably, the top surface 316 of the metallic pillar 314 is directly exposed from the dielectric material layer 320 by controlling the thickness of the dielectric material layer 320. The dielectric material layer 320 is made of low-k material having a dielectric constant of less than 3.5. The dielectric material layer 320 can be photosensitive. The photosensitive dielectric material layer can be made of negative-type polymer material, e.g. benzocyclobutene (BCB) or polyimide (PI). The photosensitive dielectric material layer can be also made of positive-type polymer material. Or, the dielectric material layer 320 can be made of non-photosensitive polymer material. In the step 422, the dielectric material layer 320 is cured.

Figure 17:
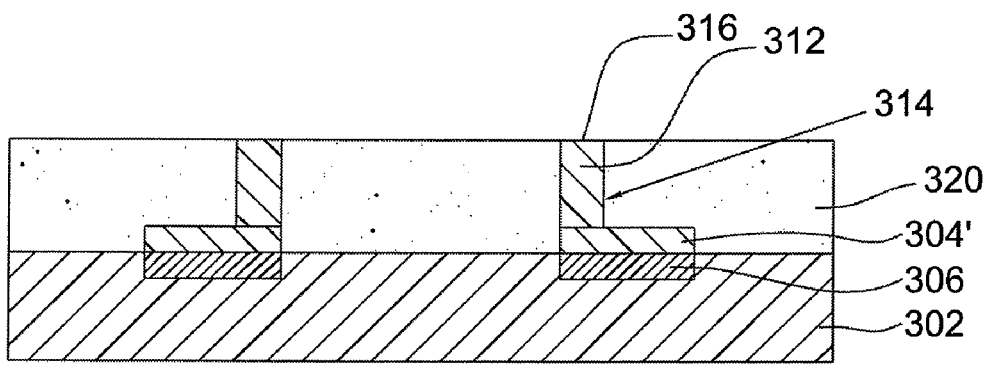

Referring to FIG. 17, in the step 424 the dielectric material layer 320 is etched to have a predetermined thickness for exposing the top surface 316 of the metallic pillar 314, thereby forming the semiconductor device 300, wherein the dielectric material layer 320 is dry-etched by an oxygen plasma etching process. More detailed, the metallic pillar 314 is a via structure, whose aspect ratio is the same as the predetermined aspect ratio (the ratio of depth D2 to width W2) of the through hole 310, e.g. the predetermined aspect ratio of the through hole 310 can be between 0.167 and 2.

Compared with the prior art, the present invention utilizes the positive-type photoresist layer to form the via structure and then utilizes low-k dielectric material to seal the via structure therein, whereby the via structure has a high aspect ratio. Furthermore, it is not necessary that the low-k dielectric material is limited to photosensitive polymer material. In other words, the low-k dielectric material can also be made of non-photosensitive polymer material. In addition, the redundant dielectric material is removed from the via structure of the present invention by using the dry etching process, thereby preventing subsequent processes from manufacturing and electrical problems.

The high aspect-ratio via structure of the present invention located in the low-k dielectric material is not only applied to the passive component (e.g. a capacitor) or Redistribution Layer in the field of semiconductor device but is also applied to the passive component or Redistribution Layer of other fields.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for manufacturing a device having a via structure, the method comprising the following steps of:
    providing a substrate;
    forming a seed metallic layer on the substrate;
    forming a patterned metallic-trace layer on the seed metallic layer;
    forming a positive-type photoresist layer on the patterned metallic-trace layer and the seed metallic layer;
    patterning the positive-type photoresist layer for defining at least one through hole which exposes a part of the patterned metallic-trace layer, wherein the through hole has a predetermined aspect ratio;
    electroplating a metallic material in the through hole so as to form a metallic pillar, wherein the metallic pillar has a top surface;
    removing the positive-type photoresist layer;
    etching a part of the seed metallic layer, whereby traces of the patterned metallic-trace layer are electrically isolated from each other; and
    forming a dielectric material layer on the substrate for sealing the patterned metallic-trace layer and a part of the metallic pillar and exposing the top surface of the metallic pillar.

2. The method as claimed in claim 1, further comprising the following step of:
    curing the dielectric material layer.

3. The method as claimed in claim 1, further comprising the following step of:
    etching the dielectric material layer to have a predetermined thickness for exposing the top surface of the metallic pillar.

4. The method as claimed in claim 1, wherein the dielectric material layer is made of low-k material having a dielectric constant of less than 3.5.

5. The method as claimed in claim 1, wherein the predetermined aspect ratio is between 0.167 and 2.

6. A method for manufacturing a device having a via structure, the method comprising the following steps of:
    providing a substrate including a plurality of pads;
    forming a metallic layer on the substrate, wherein the metallic layer is electrically connected to the pads;
    forming a positive-type photoresist layer on the metallic layer;
    patterning the positive-type photoresist layer for defining at least one through hole which exposes a part of the metallic layer, wherein the through hole has a predetermined aspect ratio;
    electroplating a metallic material in the through hole so as to form a metallic pillar, wherein the metallic pillar has a top surface;
    removing the positive-type photoresist layer;
    etching a part of the metallic layer, whereby a metallic-trace layer is formed, and the pads are electrically isolated from each other; and
    forming a dielectric material layer on the substrate for sealing the metallic layer and a part of the metallic pillar and exposing the top surface of the metallic pillar.

7. The method as claimed in claim 6, wherein the through hole corresponds to the location of the pad.

8. The method as claimed in claim 6, further comprising the following step of:
    curing the dielectric material layer.

9. The method as claimed in claim 6, further comprising the following step of:
    etching the dielectric material layer to have a predetermined thickness for exposing the top surface of the metallic pillar.

10. The method as claimed in claim 6, wherein the dielectric material layer is made of low-k material having a dielectric constant of less than 3.5.

11. The method as claimed in claim 6, wherein the predetermined aspect ratio is between 0.167 and 2.

* * * * *